(12) United States Patent
Harrington

(10) Patent No.: US 10,582,641 B2
(45) Date of Patent: Mar. 3, 2020

(54) COOLANT DISTRIBUTION UNIT

(71) Applicant: Chilldyne, Inc., Carlsbad, CA (US)

(72) Inventor: Steve Harrington, Cardiff, CA (US)

(73) Assignee: CHILLDYNE, INC., Carlsbad, CA (US)

(*) Notice: Subject to any disclaimer, the term of this patent is extended or adjusted under 35 U.S.C. 154(b) by 121 days.

(21) Appl. No.: 15/810,099

(22) Filed: Nov. 12, 2017

(65) Prior Publication Data

US 2019/0110374 A1   Apr. 11, 2019

Related U.S. Application Data

(60) Provisional application No. 62/569,786, filed on Oct. 9, 2017.

(51) Int. Cl.
| | | |
|---|---|---|
| *H05K 7/20* | (2006.01) | |
| *F04C 15/00* | (2006.01) | |
| *F04C 2/18* | (2006.01) | |
| *F04C 2/08* | (2006.01) | |
| *G06F 1/20* | (2006.01) | |
| *F04C 2/12* | (2006.01) | |
| *F28D 21/00* | (2006.01) | |

(52) U.S. Cl.
CPC ........... *H05K 7/20272* (2013.01); *F04C 2/08* (2013.01); *F04C 2/18* (2013.01); *F04C 15/008* (2013.01); *G06F 1/206* (2013.01); *H05K 7/20281* (2013.01); *H05K 7/20763* (2013.01); *H05K 7/20781* (2013.01); *H05K 7/20836* (2013.01); *F04C 2/126* (2013.01); *F04C 2270/035* (2013.01); *F05B 2210/11* (2013.01); *F05B 2260/20* (2013.01); *F28D 2021/0028* (2013.01); *G06F 2200/201* (2013.01)

(58) Field of Classification Search
CPC ........... H05K 7/20272; H05K 7/20281; H05K 7/20836; H01L 23/473; F28D 1/0246; G06F 2200/201; G06F 2021/0028; G06F 1/206; F05B 2260/20; F05B 2210/11; F04C 2/126; F04C 2270/035; F04C 2/18; F04C 15/008
USPC ....................................................... 165/11.1
See application file for complete search history.

(56) References Cited

U.S. PATENT DOCUMENTS

| | | | | |
|---|---|---|---|---|
| 4,698,728 A | * | 10/1987 | Tustaniwskyj | H05K 7/20272 165/104.31 |
| 6,279,383 B1 | * | 8/2001 | Balke | G01M 3/2876 73/40 |
| 2008/0135025 A1 | * | 6/2008 | McLain | F02D 41/0035 123/520 |
| 2012/0180979 A1 | * | 7/2012 | Harrington | F28D 1/0246 165/11.1 |
| 2014/0257721 A1 | * | 9/2014 | Thompson | G01M 3/226 702/51 |
| 2016/0205810 A1 | * | 7/2016 | Marshall | H05K 7/20272 165/11.2 |

* cited by examiner

*Primary Examiner* — Tho V Duong
(74) *Attorney, Agent, or Firm* — Manuel de la Cerra

(57) ABSTRACT

A central distribution unit (CDU) for circulating coolant is disclosed. The CDU may operate under negative pressure and can have a number of operation modes including: normal operation, pump priming, fill, drain, purge and vacuum test. The CDU includes various valves, pumps and sensors, the placement and actuation of which transitions the CDU into the various modes.

26 Claims, 9 Drawing Sheets

Normal Operation Mode

Pump Priming Mode

Fill Mode

Drain Mode

Purge Mode

Vacuum Test Mode

COOLANT DISTRIBUTION UNIT

CLAIM OF PRIORITY

The present application claims priority as a non-provisional of U.S. Pat. Ser. No. 62/569,786, filed on Oct. 9, 2017. The full disclosure of this reference is herein incorporated by reference.

The present application is also related to U.S. patent Ser. No. 14/205,777 titled "NO DRIP HOT SWAP CONNECTOR AND METHOD OF USE" and filed on Mar. 12, 2014; U.S. Pat. Serial Number PCT/US14/39854 titled "NO DRIP HOT SWAP CONNECTOR AND METHOD OF USE" and filed on May 28, 2014; U.S. Pat. Ser. No. 61/839,246 titled "DOUBLE DUCKBILL NO DRIP HOT SWAP CONNECTOR" and filed on Jun. 25, 2013; U.S. patent Ser. No. 14/289,478 titled "NO DRIP HOT SWAP CONNECTOR AND METHOD OF USE" and filed on May 28, 2014; U.S. patent Ser. No. 12/762,898 titled "VACUUM PUMPED LIQUID COOLING SYSTEM FOR COMPUTERS" and filed on Apr. 19, 2010; U.S. Pat. Serial Number PCT/US11/28360 titled "VACUUM PUMPED LIQUID COOLING SYSTEM FOR COMPUTERS" and filed on Mar. 14, 2011; U.S. patent Ser. No. 13/938,726 titled "VACUUM PUMPED LIQUID COOLING SYSTEM FOR COMPUTERS" and filed on Jul. 10, 2013; U.S. patent Ser. No. 13/308,208 titled "TURBULATOR FOR LIQUID COOLING SYSTEM FOR COMPUTERS" and filed on Nov. 30, 2011; U.S. patent Ser. No. 13/410,558 titled "COMPUTER COOLING SYSTEM AND METHOD OF USE" and filed on Mar. 2, 2012; U.S. patent Ser. No. 14/685,524 titled "COMPUTER COOLING SYSTEM AND METHOD OF USE" and filed on Apr. 13, 2015; U.S. Pat. Ser. No. 61/595,989 titled "COMPUTER COOLING SYSTEM AND METHOD OF USE" and filed on Feb. 7, 2012; and U.S. Pat. Ser. 61/451,214 titled "COOLING SYSTEM PUMP AND RESERVOIR WITH LEAK CHECKING AND PURGING" and filed on Mar. 10, 2011, all of which share a common inventor and are assigned to a common assignee. All of these applications are herein incorporated by reference in their entireties.

TECHNICAL FIELD

The present invention relates to systems and methods for cooling computer systems.

BACKGROUND

Arrays of electronic computers or components, such as those found in data centers, generate a great deal of heat. An example central processing unit of a personal computer ("CPU") generates over 100 watts of heat (some can generate much more than this) and has a maximum case temperature of about 60 C. An example array (or rack) of 88 CPUs may generate 9 kW of heat.

The standard way to keep data centers cool is to use expensive and relatively inefficient vapor-compression refrigeration systems at least part of the time. These conventional cooling or "air conditioning" systems often use more power than the computers themselves, all of which is discharged to the environment as waste heat. These systems use air as the heat transfer medium, and it is due to the low heat capacity and low thermal conductivity of air that refrigeration must be used to remove the heat generated by multiple air heat exchangers. Some operators use the evaporation of cooling liquids to cool via liquid-to-air heat exchangers. While this is more thermally efficient than refrigeration, the computers run hotter, reducing their reliability, decreasing their efficiency and making the data center uncomfortable for human occupants.

Water is used as the coolant throughout this disclosure, but it will be known to those in art that other coolants may be used. Water has approximately 4000 times more heat capacity than air of the same volume, so water is a theoretically ideal heat transfer agent for direct heat transfer from heat generating components. Other coolants offer similar performance. For example, the coolant may consist essentially of water, including tap water, or may comprise one or more perfluorocarbons or avionics cooling liquids. Liquid cooling is recognized as a thermally efficient way to cool computer CPUs due to their high concentration of power and heat generation in a small space, but the rest of a computer's electronics generate heat at a lower rate and temperature, so air-cooling is appropriate for much of the associated hardware.

Current systems may use liquid cooling to move the heat from the CPU to a radiator mounted close to the CPU, or they may use an air-to-liquid heat exchanger to remove heat from the computer enclosure. These systems suffer from the high thermal resistance and bulkiness of air-to-liquid or liquid-to-air heat exchangers. Other systems use a chilled coolant loop to cool the computer, but these systems require complex and expensive connectors and plumbing to connect the server to the building coolant supply while ensuring that no leaks occur, which may be devastating in or near a computer. Accordingly, operators of server systems are rightly concerned about leaks and reliability of using liquid to cool computers. Furthermore, chillers require a large amount of power. Additionally, for operation in a data center, servers, particularly blade servers, need to be compact.

Therefore, what is needed is a compact cooling solution adaptable for up to a large number of computers while using a minimum amount of coolant flow that is reliable, leak-free and low in power consumption.

SUMMARY

The present invention provides an elegant solution to the needs described above and offers numerous additional benefits and advantages, as will be apparent to persons of skill in the art. A central distribution unit (CDU) for circulating coolant is disclosed and claimed. The CDU may operate under negative pressure and can have a number of operation modes including: normal operation, pump priming, fill, drain, purge and vacuum test. The CDU includes various valves, pumps and sensors, the placement and actuation of which transitions the CDU into the various modes.

Specifically, the CDU may include a coolant reservoir containing the coolant connected to a blower that depressurizes the reservoir to a pressure lower than atmospheric pressure. A reversible pump is included that has a suction inlet and a pressure outlet; when the pump is operated in the forward direction, the pump circulates the coolant through a coolant circuit. This circuit includes a pump-heat exchanger coolant line coolant connected to the pressure outlet and the heat exchanger; a heat exchanger return line connected to the heat exchanger and the server loop; and a server-pump return coolant line connected to the suction inlet and the server loop. A test valve may be placed on the heat exchanger return line to inhibit coolant flow when the test valve is closed. A purge valve may be placed downstream of the test valve on the heat exchanger return line, and the purge valve allows gas to enter the heat exchanger return line when the purge valve is opened. A fill/drain branch coolant line may be connected to the server-pump return coolant line. A fill/drain valve may further be connected to the fill/drain branch coolant line, a drain valve and a fill valve connected to the fill/drain valve. The drain valve restricts coolant flow to a direction that is away from the fill/drain valve, and the fill valve restricts coolant flow to a direction that is towards the fill/drain valve.

The CDU may have one or more of the following modes: a normal operation mode wherein the blower is on, the pump is activated in the forward direction, the test valve is opened, the purge valve is closed and the fill/drain valve is closed; a fill mode wherein the pump is activated in the forward direction and the fill/drain valve is opened; a drain mode wherein the fill/drain is opened, and the pump is activated in the reverse direction; a purge mode wherein the test valve is closed, the purge valve is opened and the fill/drain valve is closed; and a vacuum test mode wherein the blower is on, the purge valve is closed, the test valve is closed, and the fill/drain valve is closed. The coolant circuit may include reservoir. The CDU may have a coolant sensor that may be used during the fill and drain modes to maintain the coolant in the reservoir within a predetermined range. Pressure sensors within the CDU may be used to confirm that the CDU is maintaining pressure within a predetermined range.

The CDU may also have a vent valve connected to the reservoir that allows gas to enter the reservoir when the vent valve is opened, wherein the drain mode further includes opening the vent valve. The blower may be reversible and when so reversed can pressurize the reservoir. The pressurization can be used in the drain mode.

The CDU may also have a coolant injector nozzle that introduces coolant from the reservoir directly into the suction inlet. The nozzle may be connected to a coolant injector nozzle valve. In such an embodiment, the CDU may also include a pump priming mode wherein the pump is activated in the forward direction and the coolant injector nozzle valve is opened.

The CDU may also have a server-pump return coolant line check valve that restricts coolant flow to the server loop to pump direction, and the drain mode further includes closing the server-pump return coolant line check valve.

A controller may be connected to the various valves and sensors and may automate the various modes of the CDU.

Further, a pump with two independent motors is disclosed and claimed. The first motor is mechanically connected to a first rotor comprising a first plurality of teeth radiating from the center of the first rotor. The second motor is mechanically connected to a second rotor comprising a second plurality of teeth radiating from the center of the first rotor, wherein the first plurality meshes with the second plurality. A sealed case may house the first and second rotors, and the case may include a suction inlet and a pressure outlet. Rotating the rotors propels a liquid from the suction inlet to the pressure outlet. Because the motors are independent of each other, when one motor fails to rotate, the other motor will rotate both rotors and maintain the propelling liquid from the suction inlet to the pressure outlet. The pump may be a gear pump or a rotary lobe pump.

The pump may also include a first motor controller electrically connected to the first motor and a second motor controller electrically connected to the second motor, with each motor controller operating its respective motor independently of the other. The controllers may be independently connected to liquid pressure sensors and may control their respective motors based on the measurements of the pressure sensor. The pump may include a sensor circuit that detects that each motor is providing torque or drawing the correct amount of current. If either motor or both motors is/are not providing torque or drawing the correct amount of current, the sensor circuit sends a signal to an alert structure.

To maintain a better seal between the rotors, the first motor may operate a torque that is different than the torque of the second motor. The mechanical connection between the rotors and motors may include a clutch that would minimize a catastrophic failure of the pump.

An injector nozzle may be used adjacent to the first and second rotors, including an injector nozzle valve, such that opening the valve introduces liquid directly to the rotors and seals the rotors. Once sealed, the valve may be closed so that the rotors can draw liquid from the suction inlet and propel it to the pressure outlet.

Additional aspects, alternatives and variations, as would be apparent to persons of skill in the art, are also disclosed herein and are specifically contemplated as included as part of the invention. The invention is set forth only in the claims as allowed by the patent office in this or related applications, and the following summary descriptions of certain examples are not in any way to limit, define or otherwise establish the scope of legal protection.

BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. Furthermore, various features of different disclosed embodiments can be combined to form additional embodiments, which are part of this disclosure. It will be understood that certain components and details may not appear in the figures to assist in more clearly describing the invention.

DETAILED DESCRIPTION

Figure 1:
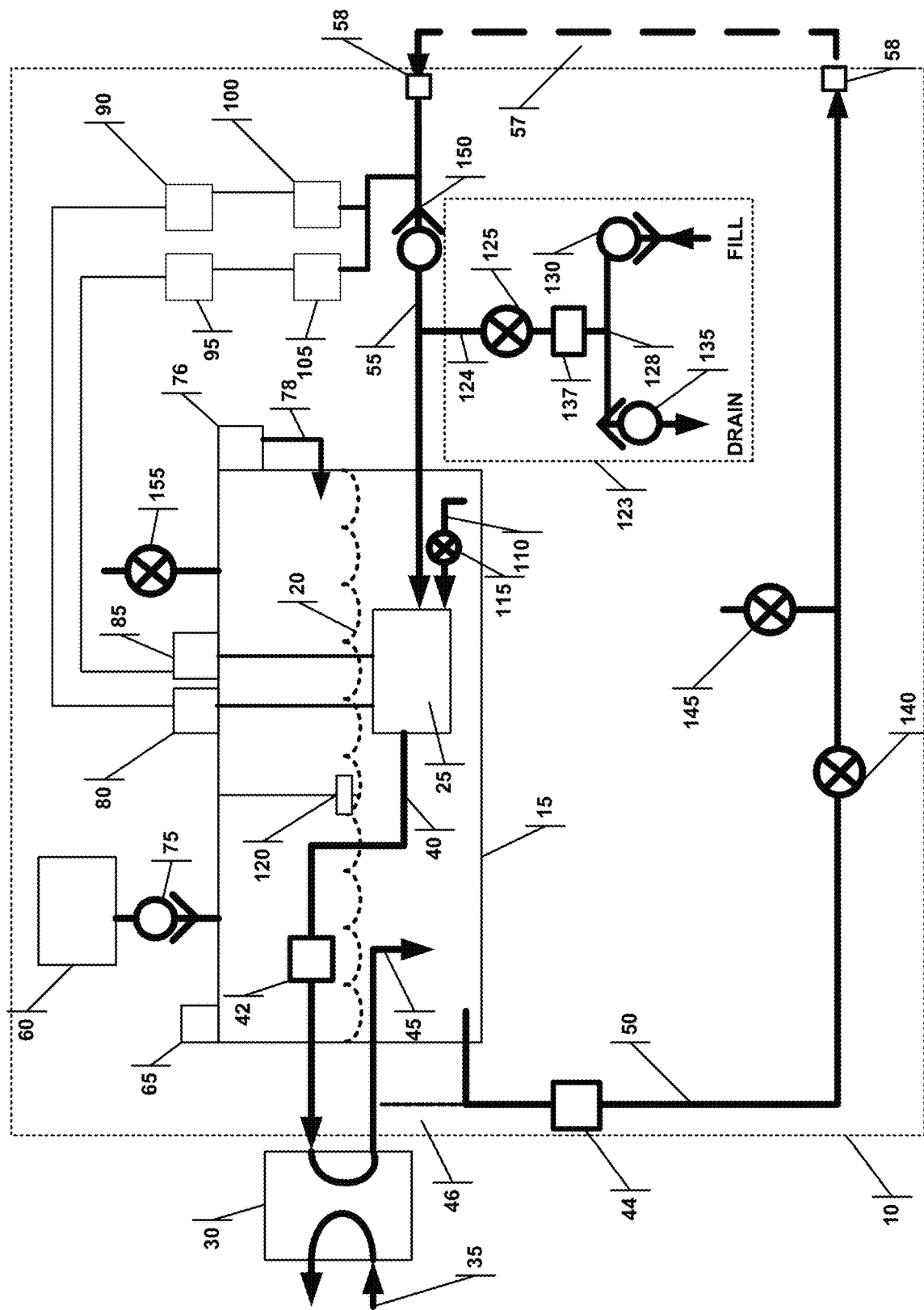
FIG. 1 illustrates a negative pressure coolant distribution unit (CDU).

Reference is made herein to some specific examples of the present invention, including any best modes contemplated by the inventor for carrying out the invention. Examples of these specific embodiments are illustrated in the accompanying figures. While the invention is described in conjunction with these specific embodiments, it will be understood that it is not intended to limit the invention to the described or illustrated embodiments. To the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, process operations well known to persons of skill in the art have not been described in detail in order not to obscure unnecessarily the present invention. Various techniques and mechanisms of the present invention will sometimes be described in singular form for clarity. However, it should be noted that some embodiments include multiple iterations of a technique or multiple mechanisms unless noted otherwise. Similarly, various steps of the methods shown and described herein are not necessarily performed in the order indicated, or performed at all in certain embodiments. Accordingly, some implementations of the methods discussed herein may include more or fewer steps than those shown or described. Further, the techniques and mechanisms of the present invention will sometimes describe a connection, relationship or communication between two or more entities. It should be noted that a connection or relationship between entities does not necessarily mean a direct, unimpeded connection, as a variety of other entities or processes may reside or occur between any two entities. Consequently, an indicated connection does not necessarily mean a direct, unimpeded connection unless otherwise noted.

The following list of example features corresponds with FIGS. 1-9B and is provided for ease of reference, where like reference numerals designate corresponding features throughout the specification and figures:

| Negative Pressure Coolant Distribution Unit | 10 |
|---|---|
| Reservoir | 15 |
| Coolant Level | 20 |
| Pump | 25 |
| Heat Exchanger | 30 |
| Facility Water | 35 |
| Pump-Heat Exchanger Coolant Line | 40 |
| 1st Temperature Sensor | 42 |
| 2nd Temperature Sensor | 44 |
| Heat Exchanger-Reservoir Coolant Return Line | 45 |
| Heat Exchanger-Server Coolant Line | 46 |
| Reservoir-Server Coolant Line | 50 |
| Server-Pump Coolant Return Line | 55 |
| Server Loop | 57 |
| Quick Disconnect Fittings | 58 |
| Blower | 60 |
| Air Pressure Sensor | 65 |
| Air Pressure Sensor Control Line | 70 |
| Blower Check Valve | 75 |
| Dehumidifier | 76 |
| Dehumidifier Coolant Return Line | 78 |
| First Pump Motor | 80 |
| Second Pump Motor | 85 |
| First Pump Motor Controller | 90 |
| Second Pump Motor Controller | 95 |
| First Coolant Pressure Sensor | 100 |
| Second Coolant Pressure Sensor | 105 |
| Coolant Injector Nozzle | 110 |
| Coolant Injector Nozzle Valve | 115 |
| Coolant Level Sensor | 120 |
| Fill/Drain Complex | 123 |
| Fill/Drain Branch | 124 |
| Fill/Drain Valve | 125 |
| Fill/Drain Tee | 128 |
| Fill Valve | 130 |
| Exterior Coolant Reservoir | 132 |
| Drain Valve | 135 |
| Test Valve | 140 |
| Purge Valve | 145 |
| Server-Pump Coolant Return Line Check Valve | 150 |
| Vent Valve | 155 |
| Normal Operation Coolant Route | 157 |
| Pump Priming Coolant Route | 158 |
| Fill Operation Coolant Route | 160 |
| Drain Operation Coolant Route | 165 |
| Purge Operation Coolant Route | 170 |

| -continued | |
|---|---|
| Motor Mechanical Connections | 171a, b |
| Clutch | 172a, b |
| Sensor Circuit | 173 |
| Rotor | 174 |
| Teeth (Gear Configuration) | 175 |
| Case | 176 |
| Rotary Lobe Pump | 177 |
| Teeth (Lobe Configuration) | 178 |
| Alert Structure | 179 |
| Suction Inlet | 180 |
| External Pump Gears | 181 |
| Pressure Outlet | 185 |
| Coolant Primer Injection | 190 |
| Controller | 195 |
| Internet/External Controller | 200 |
| Display | 205 |
| Memory | 210 |
| Dual Motor Pump | 215 |

Multimode CDU

FIG. 1 illustrates a multimode CDU; each mode is discussed in more detail below. The CDU 10 includes a reservoir 15 that is filled with a coolant at a coolant level 20. The types of coolants available are well known in the art. Coolant is circulated through to the servers by a pump 25, which may be constructed as a dual motor pump described below with regards to FIGS. 9A and 9B, as a non-limiting example. The pump 25 may be submersible into the coolant, which assists in keeping the pump 25 primed and lubricated, and negates the need for contact seals.

The pump 25 propels coolant to a heat exchanger 30 via the pump-heat exchanger coolant line 40, and back to the reservoir 15 via the heat exchanger-reservoir coolant return line 45. The heat exchanger 30 may have facility water 35 pumping through it to draw heat from the coolant. Other types of heat exchangers can be used. The coolant is further propelled by the pump 25 through the reservoir-server coolant line 50 to the server loop 57, which has one or more heat exchangers in thermal contact with electrical devices (not shown). The coolant then travels through the server-pump coolant return line 55 back into the reservoir 15. Alternatively the coolant could travel directly to the server loop 57 via coolant line 46. The coolant lines form a coolant circuit. Temperature sensors 42 and 44 may be placed on the coolant lines to determine the temperature of the coolant, which then can be used to assess the efficiency of the CDU 10.

To maintain the CDU 10 under negative pressure, a blower or pump 60 is used, and may be controlled by an air pressure sensor 65. Generally, the blower 60 would operate until the air pressure sensor 65 detects that a certain pressure has been reached, and it would then shut off the blower 60. The blower or pump 60 could also be a vane pump, regenerative blower or centrifugal blower, as non-limiting examples. A blower check valve 75 may be used to prevent an overflow of coolant from reaching, and potentially damaging, the blower 60. The reservoir 15 may have a coolant level sensor 120 that can measure the coolant level 20.

Because the system is under negative pressure, the coolant can vaporize into the air of the reservoir 15 more easily than at ambient pressure. As the blower 60 operates, it will extract this moist air from the system, and the level of coolant will diminish over time. To make the CDU 10 more robust and maintenance free, the coolant level sensor 120 may detect the amount of coolant in the reservoir 15. When the level is below a predetermined level, a dehumidifier 76 may be activated to remove the coolant from the airspace and return the coolant via the dehumidifier coolant return line 78. As a non-limiting example, the dehumidifier 76 may use a Peltier device, a Peltier heat pump, a solid state refrigerator, or a thermoelectric cooler. The dehumidifier 76 may also be placed at the exhaust of the blower 60.

The pump 25 may have two motors 80 and 85, each with its own motor controllers 90, 95 in communication with coolant pressure sensors 100, 105. The system preferably has a dual motor system to provide redundancy in the event of a motor failure. If one motor fails, the CDU 10 can continue to operate with the remaining motor, which has its own independent controller and coolant pressure sensor. The redundancy is important because such a motor failure, in the absence of redundancy, would prevent the circulation of coolant, leading to the potential failure and damage of the electrical component which the CDU is supposed to cool.

The CDU may also a fill/drain complex 123 that includes a fill/drain branch coolant line 125 that connects to a fill/drain valve 125. A fill/drain tee 128 connects the fill/drain valve to the drain valve 135 and the fill valve 130. The fill and drain valve (130 and 135) may be check valves that require no external actuation, or they may be actuated by the controller 195 (see FIG. 8). The CDU also may have other valves and structures, such as a flow meter 137, a test valve 140, a purge valve 145, a server-pump coolant return line check valve 150, and a vent valve 155. The operation of these structures is described below in relation to the various modes of operation.

Although not necessary, this CDU may be housed within a housing that can be mounted within a server rack. If facility water 35 is used with the heat exchanger 30, the facility water 35 would be under positive pressure, and care must be taken to ensure that the fittings used with the heat exchanger 30 are robust and leak-proof. Further, the CDU 10 may include quick connect fittings 58, such as those disclosed in U.S. Pat. Ser. Nos. 14/205,777, PCT/US14/39854, and 61/839,246 by the same inventor of the present application, which may be introduced between the server loop 57 and the reservoir 15. If the CDU is housed in a case that fits into the server rack, the connection fittings 58 may be mounted to the case, and accessible from the exterior of the case. This configuration facilitates easy connection and disconnection.

Figure 6:
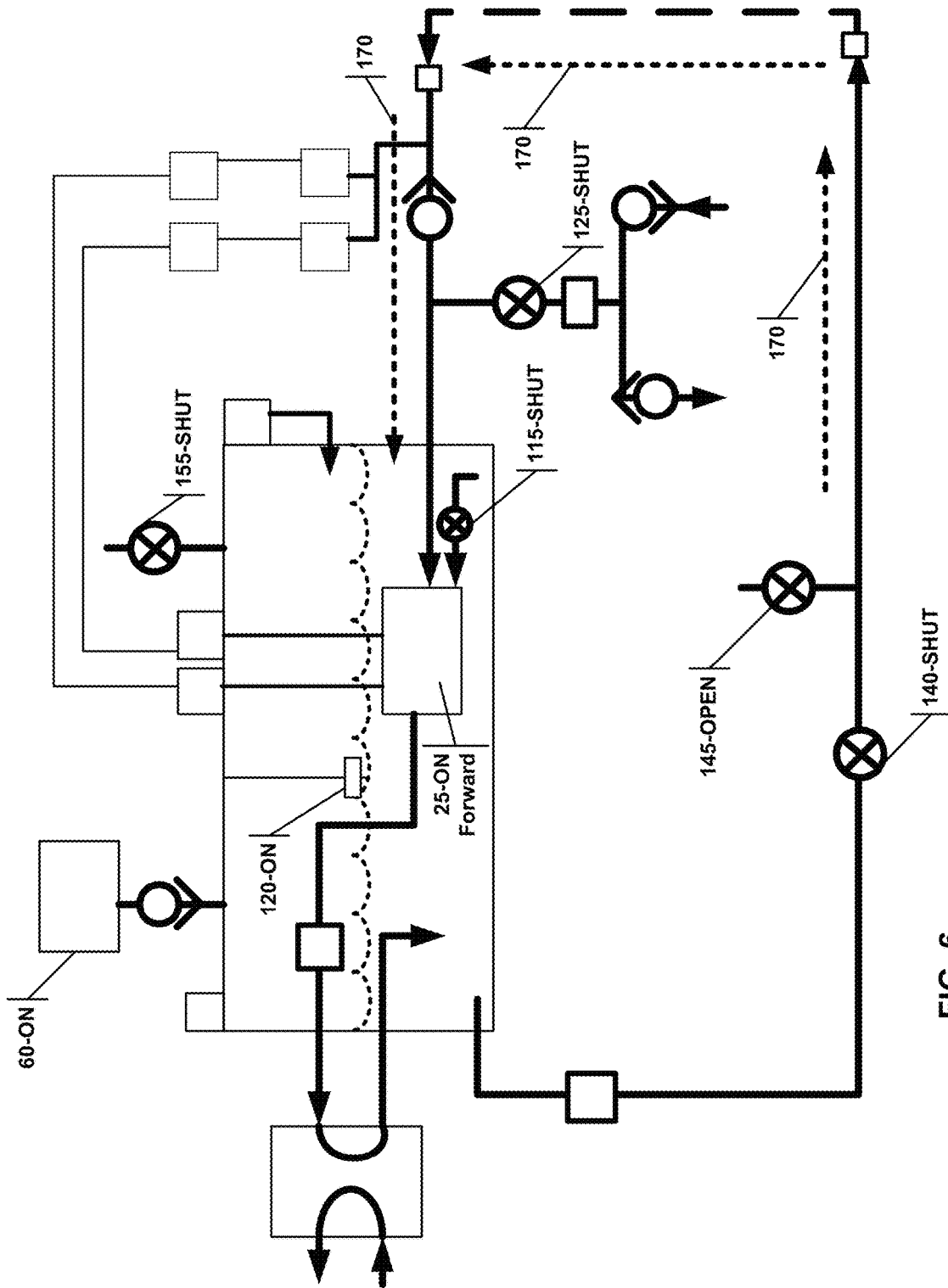
FIG. 6 illustrates the CDU in the purge mode.
Figure 7:
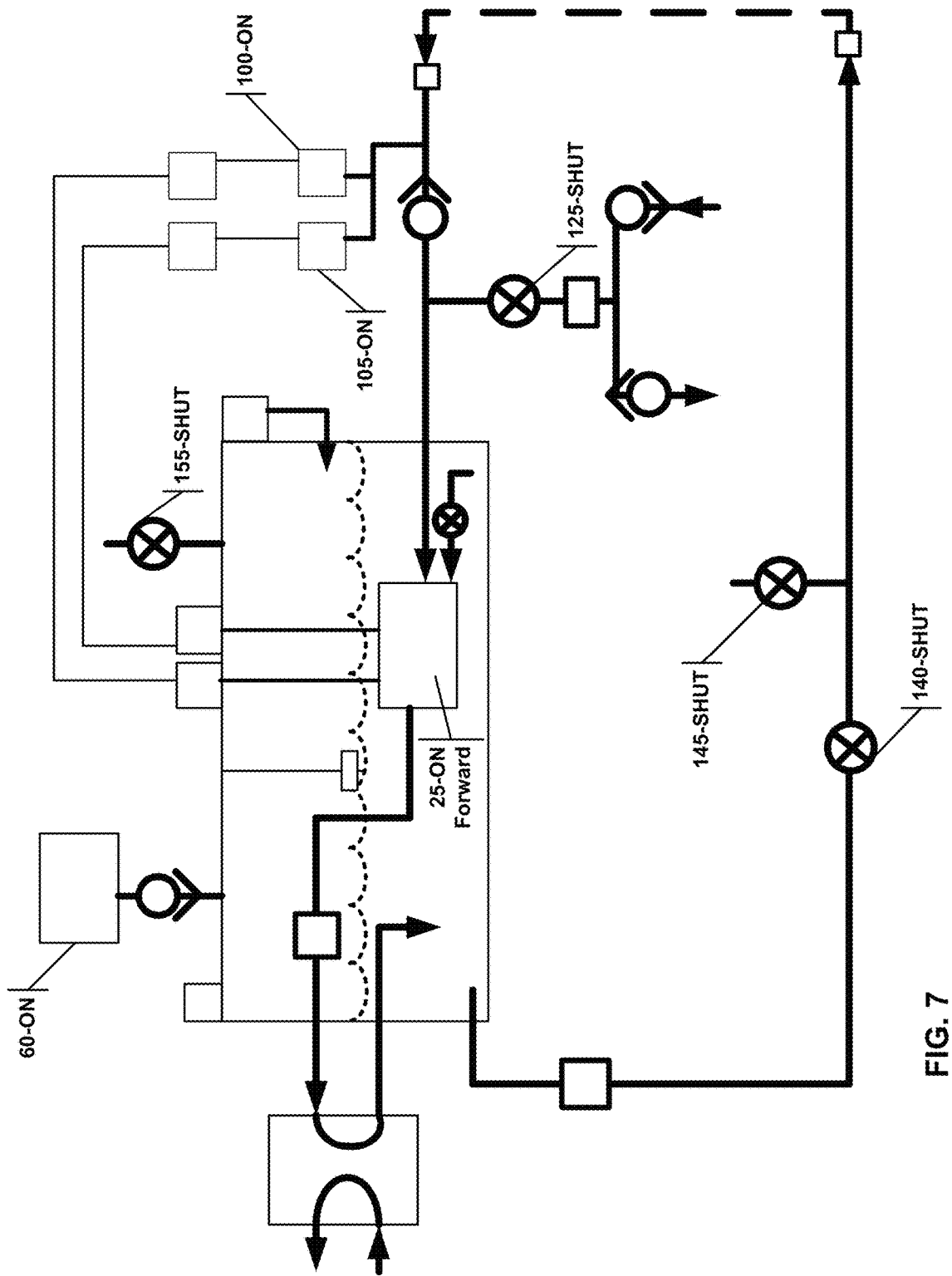
FIG. 7 illustrates the CDU in the vacuum test mode.

The CDU 10 may have various operation modes, including normal operation (FIG. 2), pump priming (FIG. 3), fill (FIG. 4), drain (FIG. 5), purge (FIG. 6), and vacuum test (FIG. 7). Each of these modes will now be described.

Figure 2:
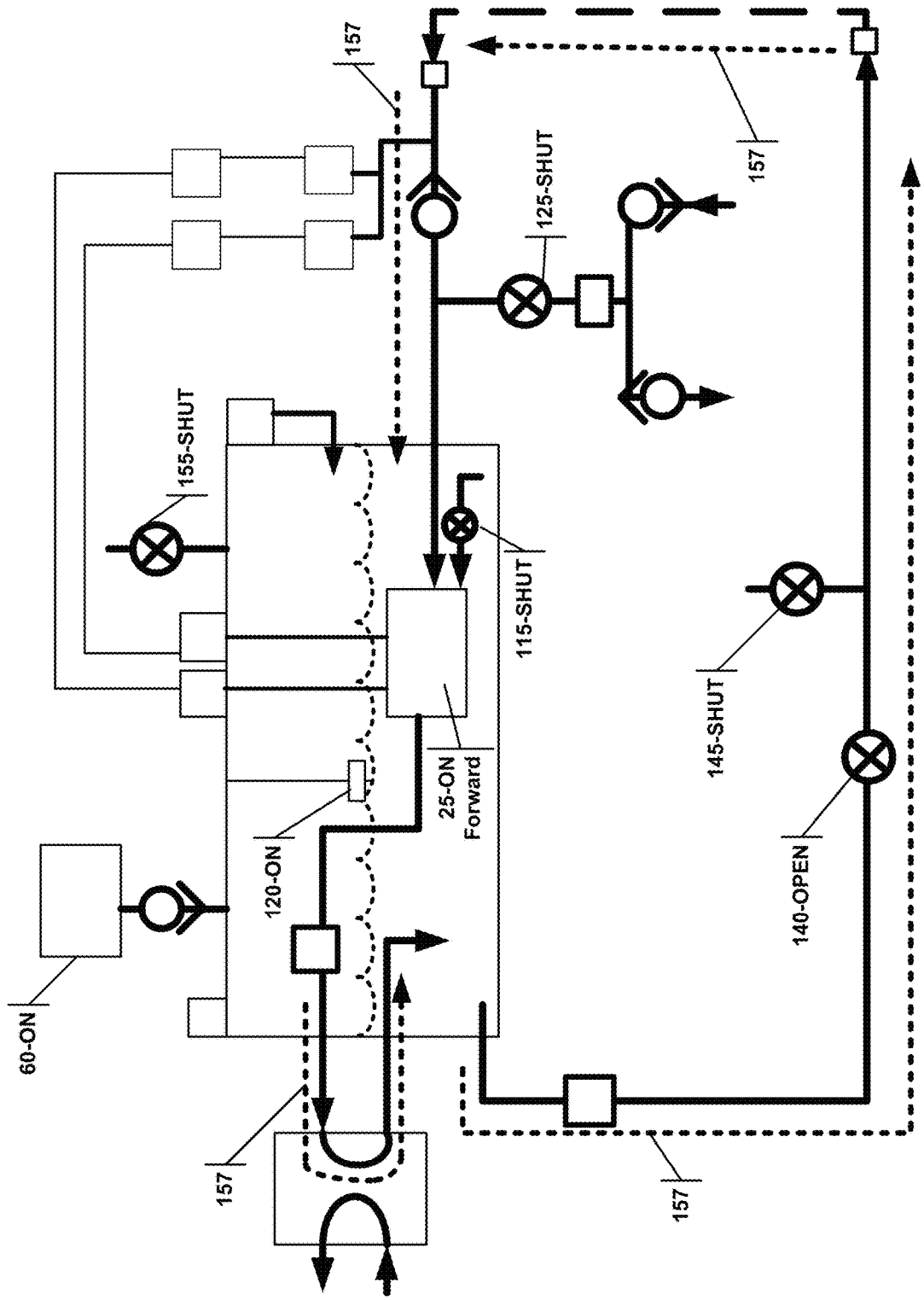
FIG. 2 illustrates the CDU in normal operation mode.

Normal Operation Mode:

In the normal operation mode shown in FIG. 2, the blower 60 is on, maintaining the CDU under negative pressure. The pump 25 is on in the forward direction, such that it can propel coolant from the reservoir 15 to the heat exchanger 30, shown by the coolant movement route 157. Coolant also moves from the reservoir 15 to the servers and back, also shown as route 157. In this mode, the coolant injector nozzle valve 115, the purge valve 145, the vent valve 155, and the fill/drain valve 125 are shut. The test valve 140 is opened. During this mode, the dehumidifier 76 may be periodically actuated based on the coolant levels detected. The purpose of the normal operation mode is to transfer heat from the servers to the facility water 35. The CDU will spend most of the time in this mode. During this operation, the controller 195 may display a number of metrics to the user, including the amount of coolant in reservoir (based on the coolant level sensor 120), the coolant pressure in the server loop (based on the first and/or second pressure sensors 100, 105), the amount of vacuum (based on the air pressure sensor 65), the temperature of the coolant before the server loop (based on the first temperature sensor 42), the temperature of the coolant after the server loop (based on the second temperature sensor 44), and the total amount of heat drawn away from the servers (based on the difference between the temperature sensors 42, 44, and the volume of coolant supplied to the server loop—i.e., the RPMs of the pump 25).

Figure 3:
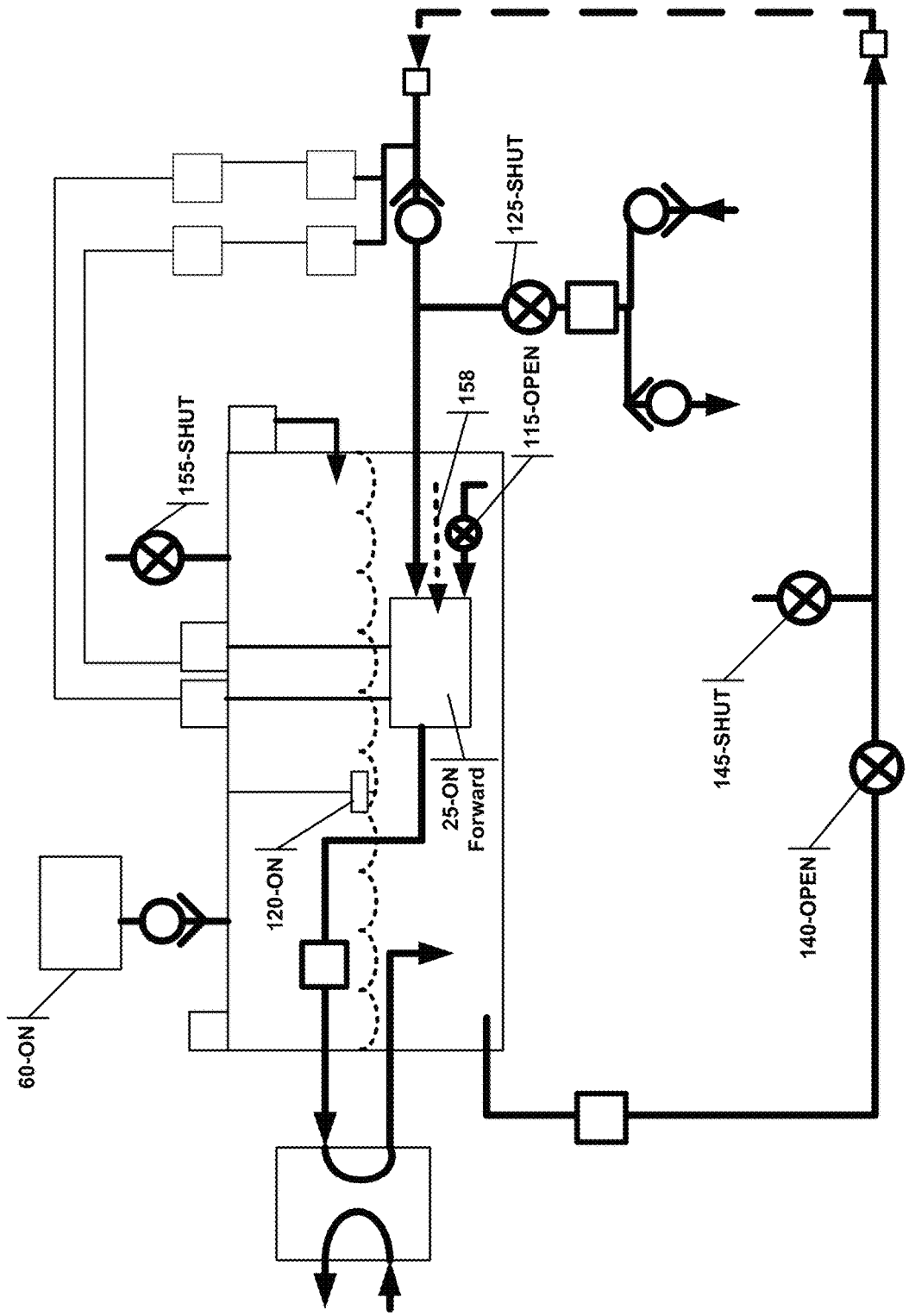
FIG. 3 illustrates the CDU in pump priming mode.

Pump Priming Mode:

In the pump priming mode shown in FIG. 3, the CDU may be in the same operational configuration as in the normal operation mode. However, the pump 25 may not be primed with coolant because, for example, the CDU is transitioning from a purge mode to a normal operation mode. At the initial stages of the normal operation mode, the coolant injector nozzle valve 115 may be opened to allow coolant to inject directly into the pump 25, as shown by coolant route 158. The coolant injector valve 115 may be a flow limiting valve that will supply a constant flow over a wide range of delta pressures, such as disclosed in U.S. Pat. No. 4,210,287, incorporated herein by reference. Once the pump 25 is primed, the coolant injector nozzle valve 115 may be shut, and normal operation can continue.

Figure 4:
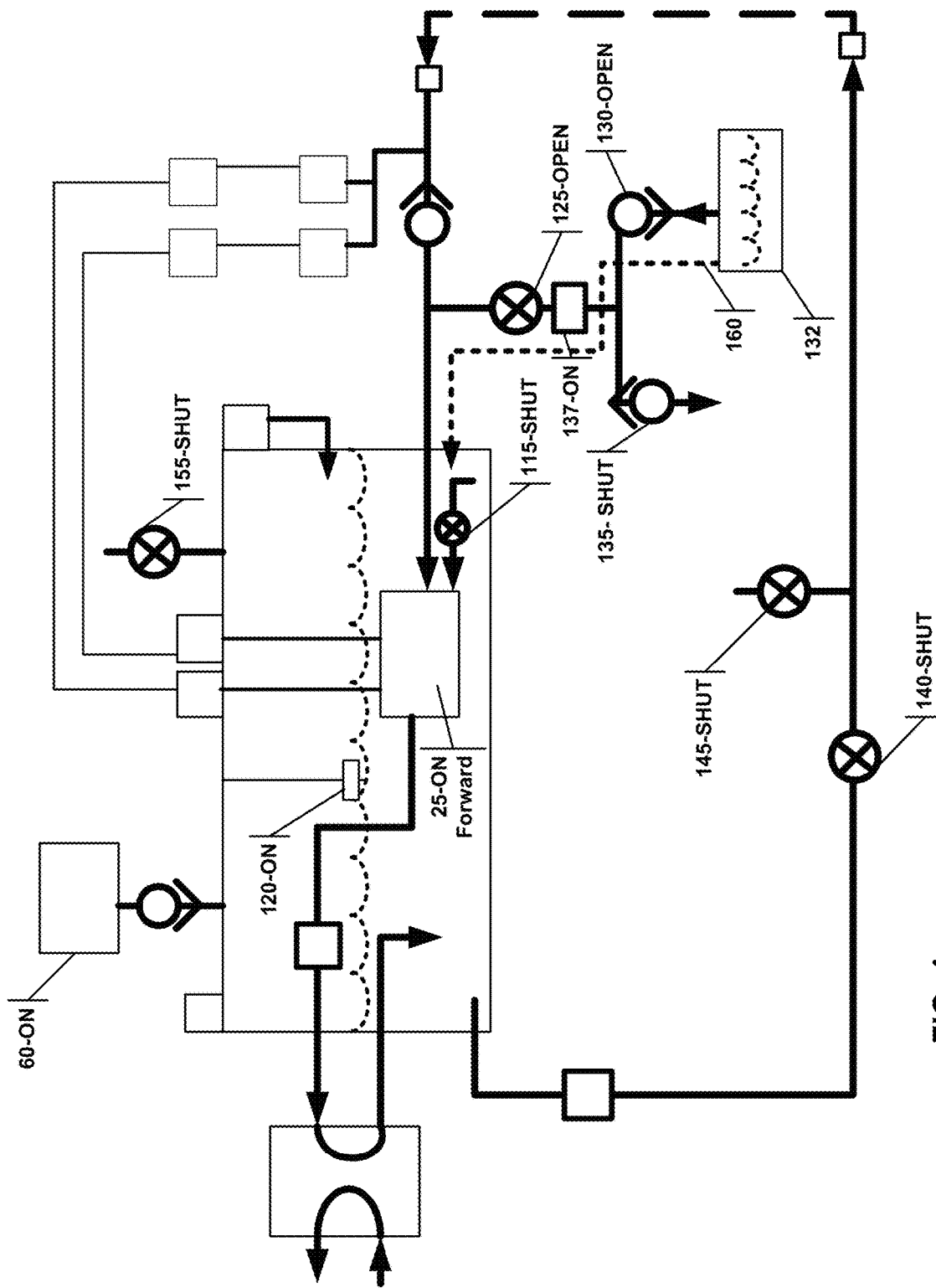
FIG. 4 illustrates the CDU in the fill mode.

Fill Mode:

In the fill mode shown in FIG. 4, the preferred configuration has the blower 60, on maintaining the CDU under negative pressure. The pump 25 is on in the forward direction. The test valve 140, the vent valve 155, the purge valve 145, and the drain valve 135 are shut, and the fill/drain valve 125 and the fill valve 130 are opened. In an alternate configuration, the blower 60 can be turned off, and the status of the test and purge valves need not be manipulated, because the pump 25 in the forward direction will still draw coolant from the external reservoir 132. While this alternate configuration is possible, it may not be optimal because, for example, leaving the purge valve 145 open would introduce air into the system.

In the preferred configuration, because the CDU is under negative pressure, the drain valve 135 will remain shut, while the fill valve 130 is opened and can suck coolant from an exterior coolant reservoir 132 along route 160. This suction of the coolant from the exterior coolant reservoir 132 continues until a high-level set-point is reached, as measured by the coolant level sensor 120. As discussed in more detail below, the fill operation can be automated by the controller 195 (FIG. 8), such that when the coolant level reaches a predetermined set point, the CDU automatically transitions to the fill mode until the high-level set point is reached, then the CDU transitions to the normal operation mode (FIG. 2). The controller 195 may display to the user via a display 205 the amount of coolant drawn into the CDU. This amount can be determined by one of two ways—the difference in the coolant level as measured by the coolant level sensor 120 from the start of the fill mode to its conclusion, or as measured from the flow meter 137, again measuring the amount of coolant flow from the start of the fill mode to its conclusion.

Figure 5:
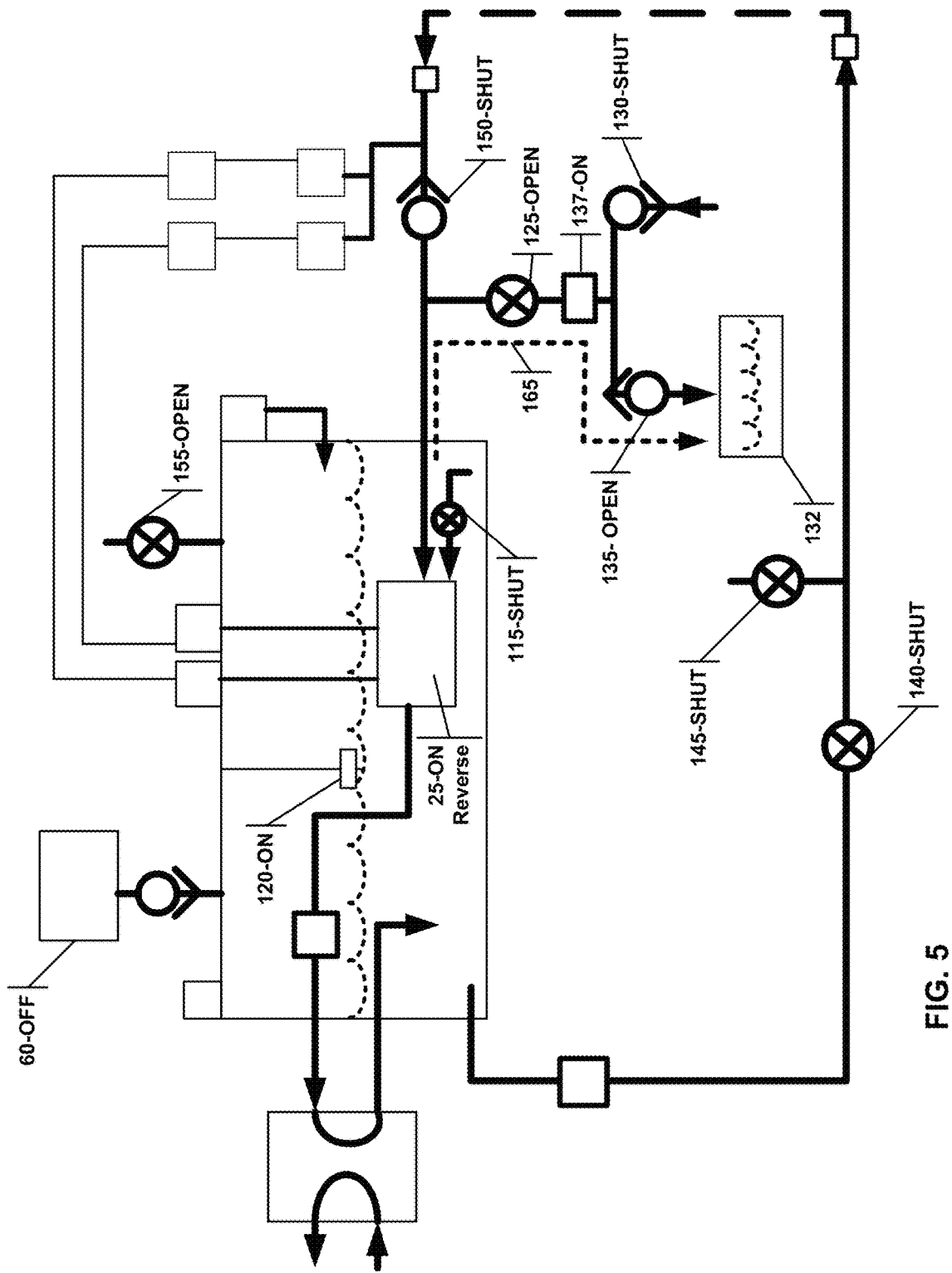
FIG. 5 illustrates the CDU in the drain mode.

Drain Mode:

In the drain mode shown in FIG. 5, in the preferred configuration the blower 60 is off, causing the CDU to be under atmospheric pressure. The pump 25 is on in the reverse direction. Test valve 140, purge valve 145 and fill valve 130 are shut, and the fill/drain valve 125, vent valve 155 and drain valve 135 are opened. It should be noted that when the fill and drain valves are check valves, the drain valve 135 will open because the CDU is under atmospheric pressure as the pump 25 is propelling coolant, while the fill valve 130 will remain closed. In an alternate configuration, the blower check valve 75 and the vent valve 155 can be removed, and the blower 60 can be turned in the reverse direction (i.e., providing positive pressure to the reservoir 15).

In either configuration, the sever-reservoir return coolant line check valve 150 will also remain closed. Coolant will be propelled from the CDU to the exterior coolant reservoir 132 along route 165. The draining of the coolant to the exterior coolant reservoir 132 continues until a low-level set point is reached, as measured by the coolant level sensor 120. It would also be apparent that the coolant can be drained to any level and need to be limited to the low-level set point. The drain mode is generally manually actuated by an operator when the CDU is in need of maintenance, or when a some of the servers have be taken off line (in this latter case, less coolant is needed, and if many servers are removed, then the reservoir may be too full and coolant should be removed). Once activated, the CDU may automate the draining until the low-level set point is reached. The controller 195 may display to the user via display 205 the amount of coolant drained from the CDU. This amount can be determined by one of two ways—the difference in the coolant level as measured by the coolant level sensor 120 from the start of the drain mode to its conclusion, or as measured from the flow meter 137, again measuring the amount of coolant flow from the start of the drain mode to its conclusion. When servers are added or removed from the system, the fill and/or drain modes can be activated. The drain mode will require the coolant circuit to stop flowing, but if the drain time is limited, then the servers can ride through the shutdown. Alternatively, an additional reversible pump, such as a gear pump, can be used for filling and draining without interrupting the coolant circuit flow.

Purge Mode:

The purge mode shown in FIG. 6 may be used when a server or group of servers must be taken offline. Essentially, the coolant is drawn out of the server loop and into the reservoir 15, thus rendering it safe to remove or otherwise repair the servers. In this mode, the blower 60 is on, maintaining the CDU under negative pressure. The pump 25 is on in the forward direction. The test valve 140, the fill/drain valve 125, and the vent valve 155 are shut, and the purge valve 145 is opened. In this valve configuration, the pump 25 will draw coolant out of the server loop 57, as shown by coolant route 170. Air at atmospheric pressure will enter the server loop through the purge valve 145. As coolant is drawn out of the server loop, the coolant level in the reservoir 15 will rise. The CDU preferably monitors the coolant level, and if the level reaches or exceeds a pre-set high-level set point, the CDU may interrupt the purge mode, transitioning to the drain mode until a lower coolant level is reached, before returning to the purge mode.

Vacuum Test Mode:

The vacuum test mode shown in FIG. 7 may be used to test the server loop for leakage before running the coolant. In this mode, the blower 60 is on, as is the pump 25 in the forward direction. The test valve 140, the purge valve 145, and the fill/drain valve are shut. The pump 25 operates until the first and second coolant pressure sensors (100, 105) reach a first vacuum set point. The CDU then waits for a predetermined time period and measures the pressure using either or both of the coolant pressure sensors (100, 105) and verifies if the pressure reading is lower than a second vacuum set point. If the measured pressure is higher than the second vacuum set poin,t the CDU will alert the user via a display 205.

Figure 8:
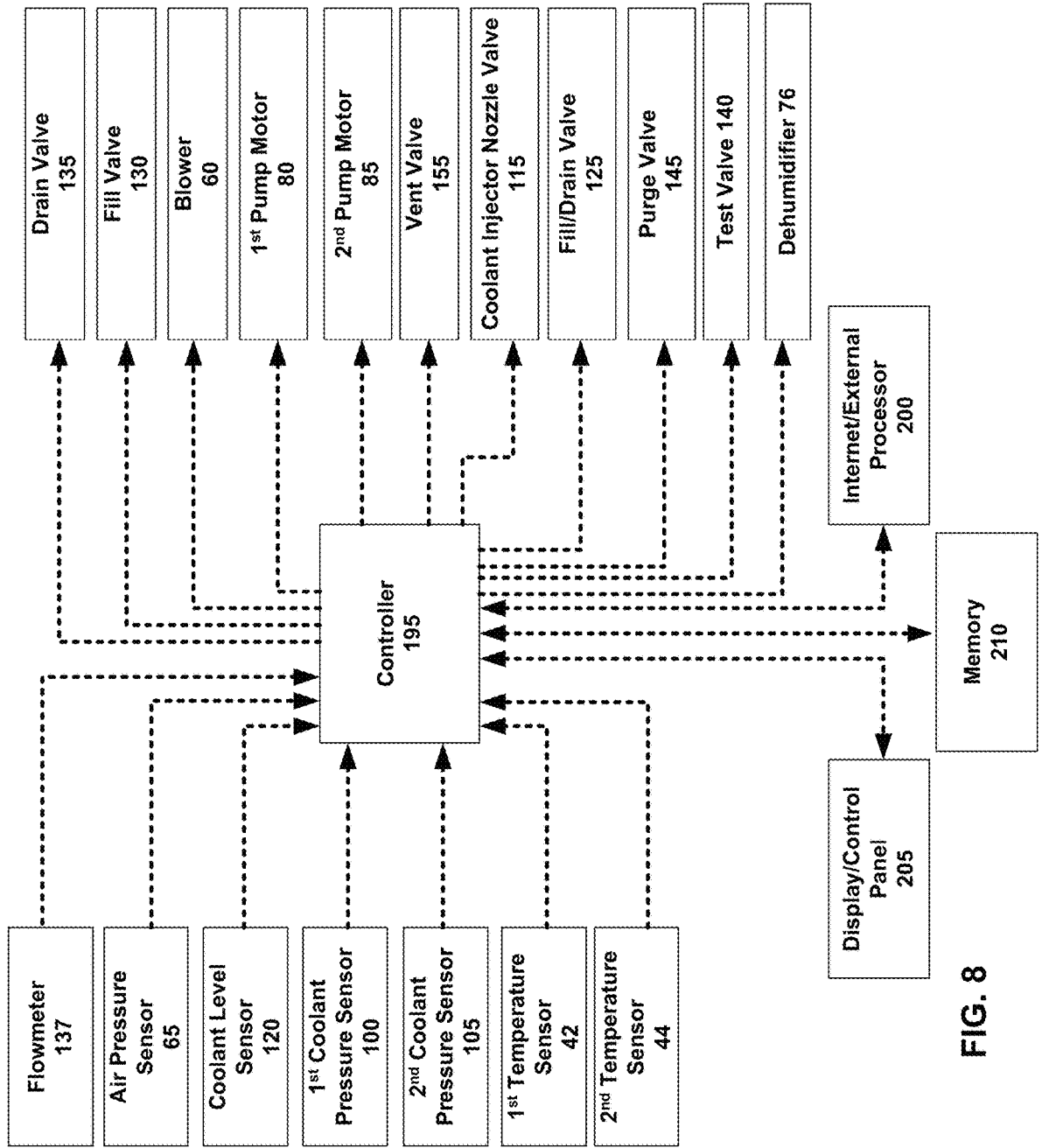
FIG. 8 illustrates the controller of the CDU.

The various components of the CDU may be controlled by a controller 195, as shown in FIG. 8. The controller 195 also receives as inputs the measurements from the various sensors, and can output to a display (such as a light panel, LCD screen, or LED screen) various metrics to the user, including the amount of coolant in reservoir (based on the coolant level sensor 120), the coolant pressure in the server loop (based on the first and/or second pressure sensors 100, 105), the amount of vacuum (based on the air pressure sensor 65), the temperature of the coolant before the server loop (based on the first temperature sensor 42), the temperature of the coolant after the server loop (based on the second temperature sensor 44), and the total amount of heat drawn away from the servers (based on the difference between the temperature sensors 42, 44, and the volume of coolant supplied to the server loop—i.e., the RPMs of the pump 25). The display may also function as a control panel, such as a touch panel screen. These metrics can also be stored in a memory 210 for later recall by the user. Or the metrics can be transmitted to an external processor 200, such as a linked processor on the internet. Such a linked processor can also control the CDU and provide all or some of the functionality that is available to the user.

The types of valves that may be controlled by the controller 195 used would be apparent to one of skill in the art and include, but are not limited to, solenoid valves, ball valves, gate valves, and pinch valves.

Dual Motor Pump

Figure 9B:
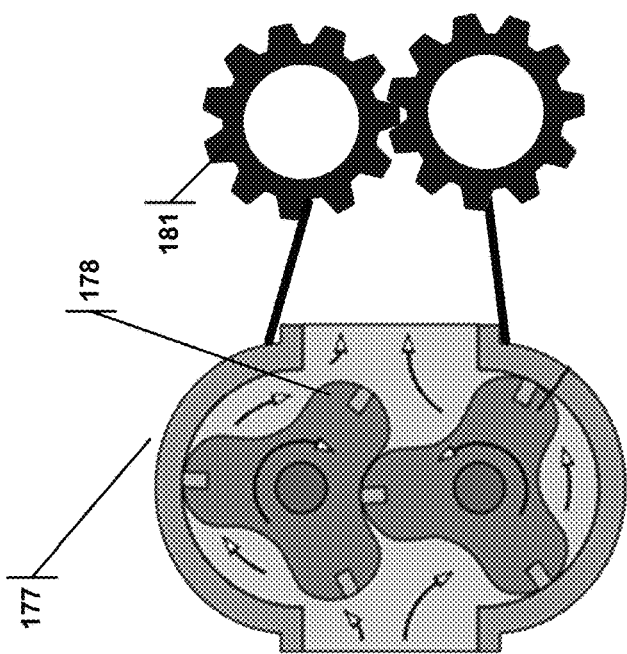
FIG. 9B illustrates a dual motor pump in a rotary lobe configuration.
Figure 9A:
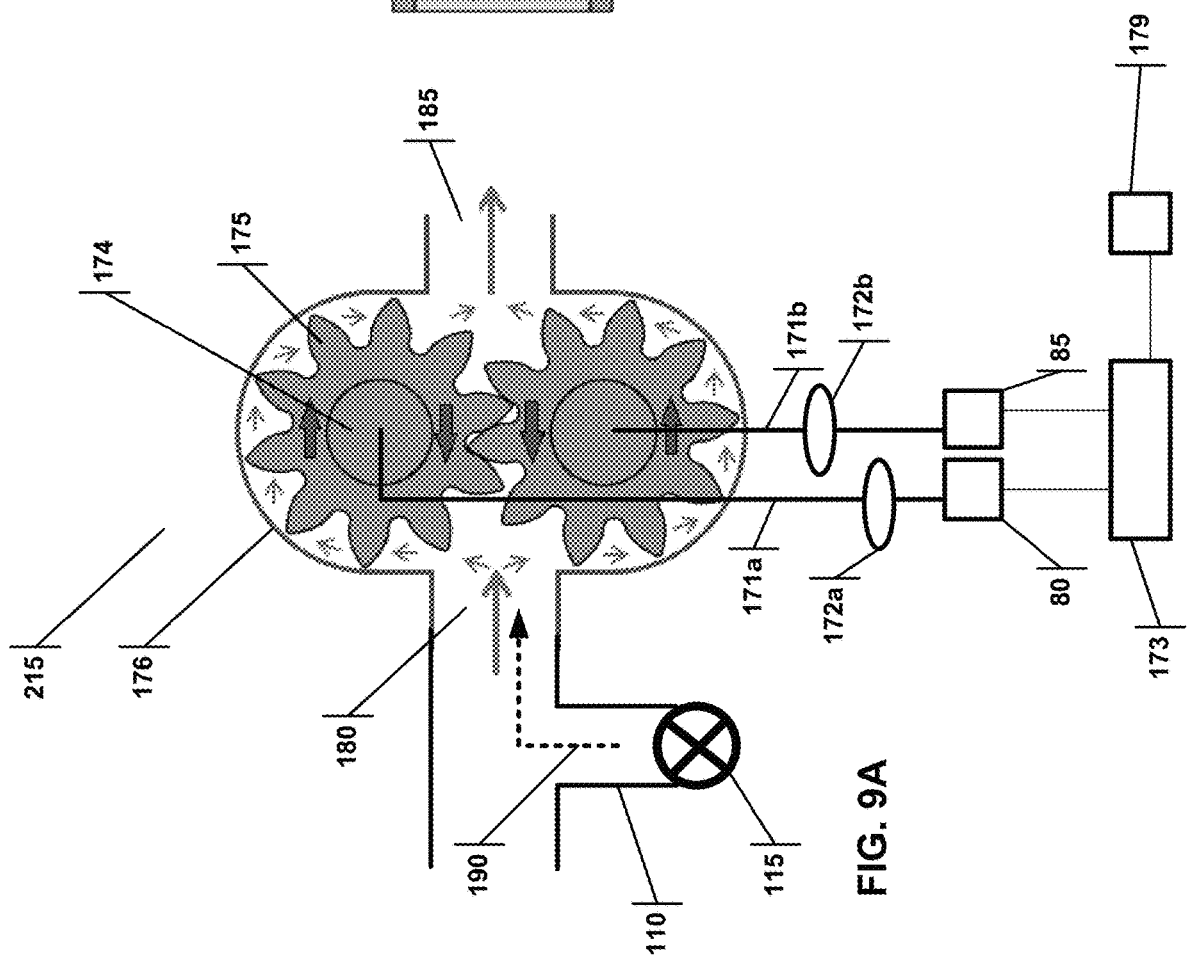
FIG. 9A illustrates a dual motor pump in a gear configuration.

The CDU just described may use a dual motor pump. Such a pump would have two motors (first pump motor 80, second pump motor 85) that each drive a rotor 174, through mechanical connections 171a, 171b, as shown in FIG. 9A. The rotors have a plurality of teeth 175 radiating from the center, and the teeth 175 from the adjacent rotors mesh with each other. An alternate embodiment is shown in FIG. 9B, showing a rotary lobe pump 177 with lobe configuration teeth 178, which can use the improvements discussed herein. The rotors 174 are housed in a case 176 with a suction inlet 180 and a pressure outlet 185. Rotation of the rotors 175 propels a liquid from the suction inlet 180 to the pressure outlet 185.

Each motor drives one rotor, motor speed and/or position and is controlled by independent motor controllers (FIG. 1; parts 90, 95) to maintain orientation for proper rotor meshing and sealing. For example, one motor can operate one rotor, and another motor can operate the other rotor, and the motor torque is controlled so that one motor is operating at a lower toque than the other motor, so as to maintain contact and sealing between the two rotors with minimum wear. The torque can also be controlled to maintain a constant pressure, so that if the flow resistance decreases, the pump will increase speed to maintain a given pressure. Each motor may include its own power supply, control circuit and pressure sensor, so that if either motor fails, then the pump still works. To make the redundancy even more robust, the motors can be independently powered by two separate circuits. Also, each motor could use a clutch 172a, 172b to drive the rotors in the pump such that a bearing failure on one motor would not lead to a pump failure. A sensor circuit 173 may be used to monitor the power draw and/or torque from the motors to confirm that both motors are still operational. In the event that one motor fails, the control circuit can notify the operator through an alert structure 179 that the motor has failed and that replacement/maintenance is necessary.

The pump 215 includes a coolant injector nozzle 110 and valve 115 that allows coolant to flow into the pump suction inlet 180, sealing the pump. The sealing coolant supply may also flow through the shafts or the rotors to provide sealing on the rotor/gear faces and the tips of the rotor/gear, thereby priming the pump 215. This may become important when the CDU is placed in the purge mode, removing coolant from the server loop. Air may be introduced into the pump 215. Upon transitioning the pump 215 into a mode where the coolant must be propelled by the pump 215, this air may render the pump 215 ineffective, despite having motors turning the rotors/gears 174. Opening coolant injector nozzle valve 115 introduces coolant through the nozzle 110 directly to the rotor/gears 174, as shown by the coolant primer injection 190, sealing and priming the pump 215. After sealing, the valve 115 can be closed, and the pump 215 can draw coolant from the suction inlet 180 and propel it to the pressure outlet 185.

When using a dual powered rotary lobe pump 177, as shown in FIG. 9B, the motor preferably may have external pump gears 181, each connected with one of the rotors 178 to ensure that the rotors 178 mesh and seal properly and maintain redundancy in the event that one of the motors fails. Indeed, a rotary lobe pump 177 need not have intermeshing rotors 178; rather, the external pump gear 181 may provide the necessary meshing and synchronization.

The invention has been described in connection with specific embodiments that illustrate examples of the invention but do not limit its scope. Various example systems have been shown and described having various aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A coolant distribution unit (CDU) adapted to circulate coolant to a heat exchanger and a server loop, wherein the server loop is in thermal connection with a plurality of electrical devices, the CDU comprising:
    a coolant reservoir containing the coolant;
    a blower connected to the coolant reservoir, the blower adapted to depressurize the reservoir to a pressure lower than atmospheric;
    a reversible pump comprising a suction inlet and pressure outlet when the pump is operated in the forward direction, the pump adapted to circulate the coolant through a coolant circuit;
    the coolant circuit connected to the pump comprising:
        a pump-heat exchanger coolant line coolant connected to the pressure outlet and adapted to connect to the heat exchanger;
        a heat exchanger return line, adapted to connect to the heat exchanger and the server loop; and
        a server-pump return coolant line connected to the suction inlet and adapted to connect to the server loop;
    a test valve on the heat exchanger return line;
    a purge valve downstream of the test valve on the heat exchanger return line, the purge valve adapted to allow gas to enter the heat exchanger return line when the purge valve is opened;
    a fill/drain branch coolant line connected to the server-pump return coolant line;
    a fill/drain valve connected to the fill/drain branch coolant line; and
    a drain valve and a fill valve connected to the fill/drain valve;
    wherein the CDU has the following modes:
        a normal operation mode wherein the blower is on, the pump is activated in the forward direction, the test valve is opened, the purge valve is closed and the fill/drain valve is closed;
        a fill mode wherein the pump is activated in the forward direction and the fill/drain valve and fill valve is opened, and the drain valve is closed;
        a drain mode wherein the fill/drain valve and drain valve are opened, the fill valve is closed, and the pump is activated in the reverse direction;
        a purge mode wherein the test valve is closed, the purge valve is opened and the fill/drain valve is closed; and
        a vacuum test mode wherein the blower is on, the purge valve is closed, the test valve is closed and the fill/drain valve is closed.

2. The CDU of claim 1, comprising controller connected to and adapted to actuate the blower, pump, purge valve, test valve and fill/drain valve.

3. The CDU of claim 1, the coolant circuit further comprising a coolant pressure sensor.

4. The CDU of claim 3, wherein the vacuum test mode further comprises taking at least two readings from the coolant pressure sensor over a predetermine time period, and if the difference between the two readings exceeds a predetermined valve, signaling on a display a vacuum test failure.

5. The CDU of claim 1, further comprising a coolant level sensor.

6. The CDU of claim 5, wherein the fill mode automatically stops when the coolant level sensor detects a coolant level that meets or exceeds a high-level coolant level setpoint.

7. The CDU of claim 5, wherein the drain mode automatically stops when the coolant level sensor detects a coolant level that meets or is lower than a low-level coolant level set point.

8. The CDU of claim 1, further comprising a vent valve connected to the reservoir and adapted to allow gas to enter the reservoir when the vent valve is opened, wherein the drain mode further comprises opening the vent valve.

9. The CDU of claim 1, wherein the blower is reversible and, when reversed, can pressurize the reservoir, wherein the drain mode further comprises activating the blower in the reverse direction.

10. The CDU of claim 1, wherein the heat exchanger return line comprises the reservoir.

11. The CDU of claim 1, further comprising a server-pump return coolant line check valve that restricts coolant flow to the server loop to pump direction, and the drain mode further comprises closing the server-pump return coolant line check valve.

12. The CDU of claim 1, wherein the coolant circuit further comprises a temperature sensor.

13. The CDU of claim 1, wherein the connection between the CDU and the server loop comprises a quick connect connector.

14. The CDU of claim 1, further comprising a coolant injector nozzle adapted to introduce coolant from the reservoir directly into the suction inlet, the nozzle further comprising a coolant injector nozzle valve, wherein the CDU further comprises a pump priming mode, wherein the pump is activated in the forward direction and the coolant injector nozzle valve is opened.

15. The CDU of claim 1, wherein either or both of the fill valve and drain valve are check valves.

16. A coolant distribution unit (CDU) constructed to circulate coolant to a heat exchanger and a server loop, wherein the server loop is in thermal connection with a plurality of electrical devices, the CDU comprising:
- a coolant reservoir containing the coolant;
- a blower connected to the coolant reservoir, the blower adapted to depressurize the reservoir to a pressure lower than atmospheric;
- a reversible pump comprising a suction inlet and pressure outlet when the pump is operated in the forward direction, the pump adapted to circulate the coolant through a coolant circuit;
- the coolant circuit connected to the pump comprising a server-pump return coolant line connected to the suction inlet and adapted to connect to the server loop;
- a fill/drain branch coolant line connected to the server-pump return coolant line;
- a fill/drain valve connected to the fill/drain branch coolant line; and
- a drain valve and a fill valve connected to the fill/drain valve;
- wherein the CDU has the following modes:
  - a normal operation mode wherein the blower is on, the pump is activated in the forward direction, a test valve is opened, a purge valve is closed and the fill/drain valve is closed;
  - a fill mode wherein the pump is activated in the forward direction and the fill/drain valve and fill valve are opened and the drain valve is closed; and a drain mode wherein the fill/drain valve and drain valve are opened, the fill valve is closed, and the pump is activated in the reverse direction.

17. The CDU of claim 16, wherein the blower is reversible and when reversed can pressurize the reservoir, wherein the drain mode further comprises activating the blower in the reverse direction.

18. The CDU of claim 16, further comprising a vent valve connected to the reservoir and adapted to allow gas to enter the reservoir when the vent valve is opened, wherein the drain mode further comprises opening the vent valve.

19. The CDU of claim 16, wherein the heat exchanger return line comprises the reservoir.

20. The CDU of claim 16, further comprising a coolant level sensor.

21. The CDU of claim 20, wherein the fill mode automatically stops when the coolant level sensor detects a coolant level that meets or exceeds a high-level coolant level set-point.

22. The CDU of claim 20, wherein the drain mode automatically stops when the coolant level sensor detects a coolant level that meets or is lower than a low-level coolant level set-point.

23. The CDU of claim 16, further comprising a server-pump return coolant line check valve that restricts coolant flow to the server loop to pump direction, and the drain mode further comprises closing the server-pump return coolant line check valve.

24. The CDU of claim 16 wherein either or both of the fill valve and the drain valve are check valves.

25. A coolant distribution unit (CDU) adapted to circulate coolant to a heat exchanger and a server loop, wherein the server loop is in thermal connection with a plurality of electrical devices, the CDU comprising:
- a coolant reservoir containing the coolant;
- a coolant level sensor;
- a blower connected to the coolant reservoir, the blower adapted to depressurize the reservoir to a pressure lower than atmospheric;
- a pump adapted to circulate the coolant through a coolant circuit;
- the coolant circuit connected to the pump comprising a heat exchanger return line, adapted to connect to the heat exchanger and the server loop;
- a test valve on the heat exchanger return line; and
- a purge valve downstream of the test valve on the heat exchanger return line, the purge valve adapted to allow gas to enter the heat exchanger return line when the purge valve is opened;
- wherein the CDU has the following modes:
  - a normal operation mode wherein the blower is on, the pump is activated, the test valve is opened, and the purge valve is closed;
  - a purge mode wherein the test valve is closed, and the purge valve is opened; and
  - a vacuum test mode wherein the blower is on, the purge valve is closed, and the test valve is closed;
  - wherein the purge mode automatically stops when the coolant level sensor detects a coolant level that meets or exceeds a high-level coolant level set point.

26. A coolant distribution unit (CDU) adapted to circulate coolant to a heat exchanger and a server loop, wherein the server loop is in thermal connection with a plurality of electrical devices, the CDU comprising:
- a coolant reservoir containing the coolant;
- a coolant pressure sensor;
- a blower connected to the coolant reservoir, the blower adapted to depressurize the reservoir to a pressure lower than atmospheric;
- a pump adapted to circulate the coolant through a coolant circuit;
- the coolant circuit connected to the pump comprising a heat exchanger return line, adapted to connect to the heat exchanger and the server loop;
- a test valve on the heat exchanger return line; and
- a purge valve downstream of the test valve on the heat exchanger return line, the purge valve adapted to allow gas to enter the heat exchanger return line when the purge valve is opened;
- wherein the CDU has the following modes:
  - a normal operation mode wherein the blower is on, the pump is activated, the test valve is opened, and the purge valve is closed;
  - a purge mode wherein the test valve is closed, and the purge valve is opened; and
  - a vacuum test mode wherein the blower is on, the purge valve is closed, and the test valve is closed;
  - wherein the vacuum test mode further comprises taking at least two readings from the coolant pressure sensor over a predetermine time period, and if the difference between the two readings exceeds a predetermined valve, signaling on a display a vacuum test failure.

* * * * *